(12) United States Patent
Li et al.

(10) Patent No.: US 11,075,356 B2
(45) Date of Patent: Jul. 27, 2021

(54) DISPLAY SUBSTRATE, MANUFACTURING METHOD THEREOF, DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Fashun Li, Beijing (CN); Dan Jia, Beijing (CN); Longlong Yang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 75 days.

(21) Appl. No.: 16/483,357

(22) PCT Filed: Dec. 19, 2018

(86) PCT No.: PCT/CN2018/122065
§ 371 (c)(1),
(2) Date: Aug. 2, 2019

(87) PCT Pub. No.: WO2019/153903
PCT Pub. Date: Aug. 15, 2019

(65) Prior Publication Data
US 2020/0358026 A1    Nov. 12, 2020

(30) Foreign Application Priority Data

Feb. 11, 2018   (CN) .......................... 201810142746.4

(51) Int. Cl.
*H01L 51/52*   (2006.01)
*H01L 27/32*   (2006.01)
*H01L 51/56*   (2006.01)

(52) U.S. Cl.
CPC ...... *H01L 51/5246* (2013.01); *H01L 27/3246* (2013.01); *H01L 51/56* (2013.01); *H01L 2227/323* (2013.01)

(58) Field of Classification Search
None
See application file for complete search history.

(56) References Cited

U.S. PATENT DOCUMENTS

| 2015/0084498 A1* | 3/2015 | Choi | H01L 51/5246 313/504 |
| 2016/0011444 A1* | 1/2016 | Xie | G02F 1/1339 349/153 |
| 2016/0293883 A1* | 10/2016 | Hong | H01L 51/5246 |

FOREIGN PATENT DOCUMENTS

| CN | 105652526 A | 6/2016 |
| CN | 106025096 A | 10/2016 |

(Continued)

*Primary Examiner* — Bo B Jang
(74) *Attorney, Agent, or Firm* — Myers Bigel, P.A.

(57) ABSTRACT

A display substrate, a manufacturing method thereof, and a display device are provided, which pertain to the field of display technologies. The display substrate includes a display area and a package area surrounding the display area. The display substrate includes a base substrate and an interlayer insulating layer on the substrate. The interlayer insulating layer has a groove, an orthographic projection of the groove on the base substrate is located within an orthographic projection of the package area on the base substrate, and the groove is provided with a sealing material.

19 Claims, 4 Drawing Sheets

(56) References Cited

FOREIGN PATENT DOCUMENTS

| CN | 106920889 A | 7/2017 |
|----|-------------|--------|
| CN | 108321180 A | 7/2018 |
| CN | 207765449 U | 8/2018 |
| JP | 2009-175497 A | 8/2009 |

* cited by examiner

DISPLAY SUBSTRATE, MANUFACTURING METHOD THEREOF, DISPLAY DEVICE

RELATED APPLICATION

The present application is a 35 U.S.C. 371 national stage application of PCT International Application No. PCT/CN2018/122065, filed on Dec. 19, 2018, which claims the benefit of Chinese Patent Application No. 201810142746.4, filed on Feb. 11, 2018, the entire disclosure of which is incorporated herein by reference.

TECHNICAL FIELD

The present disclosure relates to the field of display technologies, and specifically to a display substrate, a manufacturing method thereof, and a display device.

BACKGROUND

An existing display device typically comprises at least two substrates. For example, for an organic light emitting diode (OLED) display device, it comprises a base substrate and a cover plate. For a liquid crystal display device, it comprises a base substrate and a color filter substrate, and the base substrate is also referred to as an array substrate. In order to form a complete display device, it is necessary to package and assemble the base substrate and the cover plate or the color filter substrate. Generally, such packaging is required to have high airtightness to prevent substances such as moisture and oxygen in the external environment from entering the inside of a display device, which should have caused an unfavorable impact such as corrosion on sensitive components in the display device.

SUMMARY

An embodiment of the disclosure provides a display substrate comprising a display area and a package area surrounding the display area. The display substrate comprises a base substrate and an interlayer insulating layer on the base substrate, the interlayer insulating layer comprises a groove, an orthographic projection of the groove on the base substrate is located within an orthographic projection of the package area on the base substrate, the display substrate further comprises a sealing material within the groove.

In some embodiments, an angle between a side wall of the groove and a bottom surface of the groove is an obtuse angle.

In some embodiments, the interlayer insulating layer comprises a pixel defining layer, the pixel defining layer comprises a plurality of openings to define a plurality of pixels in the display area, the display substrate further comprises an electroluminescent material in each of the plurality of openings.

In some embodiments, the display substrate further comprises a pixel driving circuit on the base substrate, the interlayer insulating layer comprises a planarization layer over the pixel driving circuit.

In some embodiments, the sealing material comprises a frit.

In some embodiments, the sealing material comprises a UV glue.

Another embodiment of the disclosure provides a method for manufacturing a display substrate, the method comprising: providing a base substrate comprising a display area and a package area surrounding the display area; forming an interlayer insulating layer on the base substrate, the interlayer insulating layer comprising a groove, an orthographic projection of the groove on the base substrate being located within the package area; and providing a sealing material in the groove.

In some embodiments, a gap exists between the sealing material and a side wall of the groove.

In some embodiments, an angle between a side wall of the groove and a bottom surface of the groove is an obtuse angle.

In some embodiments, forming the interlayer insulating layer comprises: forming an insulating material layer over the base substrate, and patterning the insulating material layer to form a plurality of openings in the insulating material layer to thereby obtain a pixel defining layer, an orthographic projection of each of the plurality of openings on the base substrate being located within the display area; and providing an electroluminescent material in each of the plurality of openings.

In some embodiments, the plurality of openings and the groove are formed during a same patterning process.

In some embodiments, the method further comprises fabricating a pixel driving circuit on the base substrate, forming the interlayer insulating layer comprises: forming a planarization layer on the pixel driving circuit, and forming the groove in the planarization layer.

In some embodiments, the sealing material comprises a frit or a UV glue.

Yet another embodiment of the disclosure provides a display device comprising the display substrate according to any one of the foregoing embodiments.

DETAILED DESCRIPTION OF EMBODIMENTS

To enable those skilled in the art to better understand the technical solutions of the present disclosure, the present disclosure will be further described in detail below in conjunction with the accompanying drawings and specific embodiments.

In a process for manufacturing a display device, a sealing material is typically irradiated with a laser beam to enable the base substrate of a display device to be tightly bonded to the cover plate or another substrate thereof. Inventors of the application found that during the process of irradiating the sealing material with the laser beam in the packaging process, the laser beam cannot always be irradiated onto edges of the sealing material, such that the finally formed sealing structure exhibits burr-like side faces, which is disadvantageous for airtightness of packaging and even leads to an invalid package area, resulting in poor reliability of the package area, thereby affecting the lifetimes of components in the display device.

Figure 1:
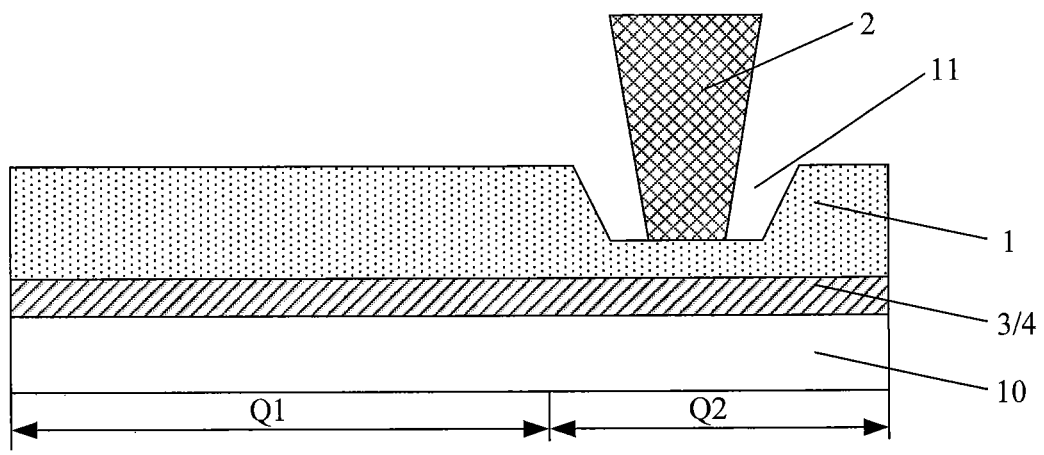
FIG. 1 schematically shows a partial sectional view of a display substrate provided by an embodiment of the present disclosure prior to packaging.

FIG. 1 schematically shows a partial sectional view of a display substrate provided by an embodiment of the disclosure prior to packaging. As shown in FIG. 1, the display substrate has a display area Q1 and a package area Q2 surrounding the display area, and the display substrate comprises a base substrate 10 and an interlayer insulating layer 1 on the base substrate 10. The interlayer insulating layer 1 comprises a groove 11. The orthographic projection of the groove 11 on the base substrate 10 is located within that of the package area on the base substrate 10. A sealing material 2 is arranged within the groove 11. Examples of the sealing material 2 include, but are not limited to, a frit, a UV glue, and the like.

It is to be noted here that terms such as "over", "above" and the like mentioned herein do not mean that two objects modified by these terms must be in direct contact with each other. In other words, any suitable intermediate structure may be present between the two objects. In the example of FIG. 1, an intermediate structure 3 between the interlayer insulating layer 1 and the base substrate 10 is schematically shown. The intermediate structure 3 may comprise a pixel driving circuit and the like. Therefore, the display substrate claimed in the present application is not limited by the examples shown in the drawings, and any number of intermediate layer structures may be provided between the base substrate 10 and the interlayer insulating layer 1 according to actual requirements of the display device. Since the groove 11 is formed in the interlayer insulating layer 1 of the display substrate in this embodiment, and the sealing material 2 is disposed in the groove 11, during the process of performing a packaging process on the display substrate, when light (for example, laser light) is irradiated over the groove, the side walls of the groove 11 may reflect a part of the light to the sealing material 2, so the side faces of the sealing material 2 can receive more light irradiation, so that the side faces of the sealing material 2 are sintered, which can thus mitigate or avoid the formation of an invalid package area, thereby achieving a better packaging effect between the display substrate and another substrate (for example, a cover plate).

Figure 2:
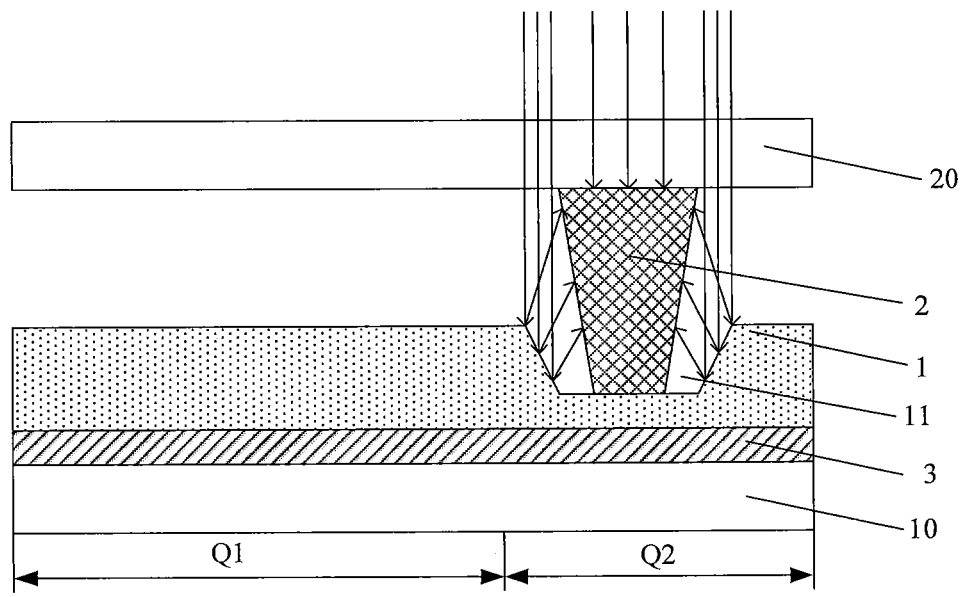
FIG. 2 schematically shows a partial sectional view of a display substrate provided by an embodiment of the present disclosure during packaging.

In this embodiment, the width of the bottom surface of the cross section of the groove 11 is larger than the width of the surface of the sealing material 2 in contact with the interlayer insulating layer 1 during the packaging process. That is, the width of the groove 11 is larger than the width of the sealing material 2. As a result, as shown in FIG. 2, light irradiated onto the side walls of the groove 11 can be reflected by the side walls of the groove 11 to reach the sealing material 2 as much as possible, such that the side faces of the sealing material 2 are sufficiently sintered.

In some embodiments, the angle between the side wall of the groove 11 and the bottom surface thereof is an obtuse angle, for example, the obtuse angle ranges from 115° to 165°. Of course, the range of the obtuse angle may also be specifically set according to practical applications. Therefore, in this embodiment, with the groove 11 itself, some of the light irradiated onto the side walls of the groove 11 is enabled to be reflected to the sealing material 2.

The display substrate of the embodiment may be an OLED substrate or an array substrate used in a liquid crystal panel. Embodiments of the display substrate will be specifically described below in conjunction with the above two different types of display substrates.

Figure 3:
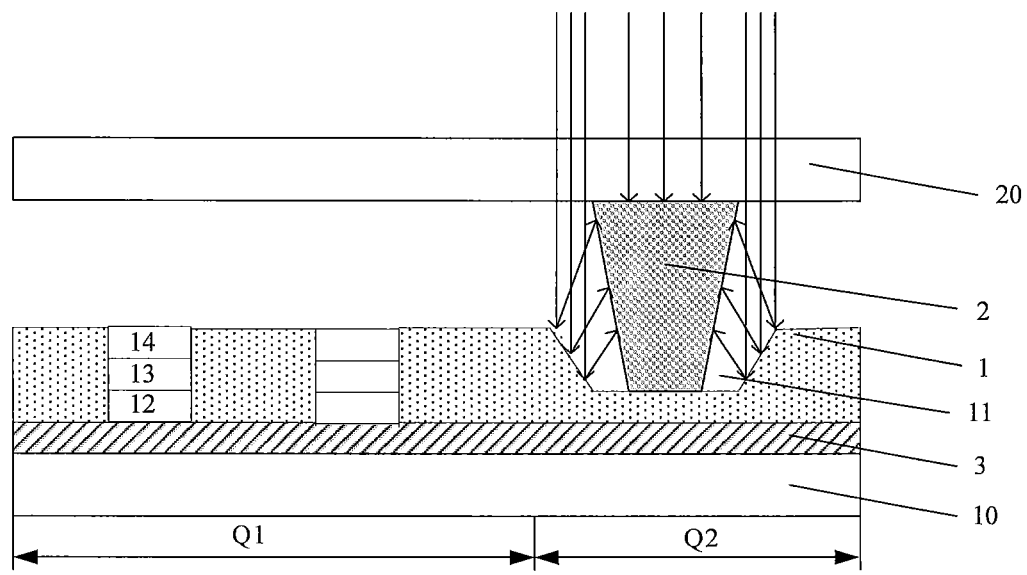
FIG. 3 schematically shows a partial sectional view of a display substrate provided by another embodiment of the disclosure during packaging.

In a first example, the display substrate of the embodiment is an OLED substrate. As shown in FIG. 3, in this case, the interlayer insulating layer 1 comprises a pixel defining layer, the pixel defining layer comprises a plurality of openings to define a plurality of pixels in the display area Q1, and each of the openings is provided with an electroluminescent material 13. A pixel driving circuit 3 is disposed on the base substrate 10. The pattern of an anode 12 of an organic electroluminescent device is disposed above the pixel driving circuit, and the anode 12 of the organic electroluminescent device is connected to a drain of a driving transistor in the pixel driving circuit. The opening of the pixel defining layer is located within the display area Q1 and exposes the anode 12 of the organic electroluminescent device, and the electroluminescent material 13 and the cathode 14 may be disposed above the anode 12. A groove 11 is provided at a position of the pixel defining layer corresponding to the package area Q2, and a sealing material 2 is disposed in the groove 11. During the process of packaging the display substrate, the side walls of the groove 11 are capable of reflecting light irradiated thereon to the sealing material 2. As a result, light irradiated onto the side walls of the groove 11 can be reflected by the side walls of the groove 11 and then reach the sealing material 2, in this way, light can be irradiated onto the sealing material 2 as much as possible, such that the side faces of the sealing material 2 are sufficiently sintered.

In some embodiments, the sealing material 2 described above comprises a frit. Of course, other materials may also be used for sealing.

According to a further embodiment of the present disclosure, the display substrate comprises a pixel driving circuit on the base substrate, and the interlayer insulating layer comprises a planarization layer over the pixel driving circuit. For example, referring again to FIG. 2, a pixel driving circuit 3 may be disposed on the base substrate 10, and the interlayer insulating layer 1 comprises a planarization layer over the pixel driving circuit 3. In this embodiment, the display substrate may be an array substrate of a liquid crystal panel. The sealing material 2 of the array substrate may comprise a UV glue, the interlayer insulating layer 1 comprises a planarization layer of the array substrate, and the groove 11 is located in the package area Q2 of the planarization layer. Therefore, during the process of packaging the display substrate, the side walls of the groove 11 enable light irradiated thereon to be reflected to the UV glue, so that the UV glue can be cured by receiving light from different directions when it is subjected to light irradiation.

Another embodiment of the disclosure provides a method for manufacturing a display substrate, which is capable of manufacturing the display substrate described in the foregoing embodiments. The method comprises the following steps: providing a base substrate having a display area and a package area surrounding the display area; forming an interlayer insulating layer on the base substrate, the interlayer insulating layer comprising a groove, an orthographic projection of the groove on the base substrate being located within the package area; providing a sealing material in the groove. For example, referring again to FIG. 1, the display substrate is divided into a display area Q1 and a package area Q2 surrounding the display area Q1. It is possible to form an interlayer insulating layer 1 on a base substrate 10, and a groove 11 is formed in the interlayer insulting layer 1 at a position corresponding to the package area Q2, a sealing material 2 is arranged in the groove 11.

In the method for manufacturing a display substrate according to this embodiment, the groove 11 is formed in the interlayer insulating layer 1, and the sealing material 2 is arranged in the groove 1. As a result, when a packaging process is performed to the display substrate, if light (for example, laser light) is irradiated over the groove, the side walls of the groove 11 can reflect a part of the light to the sealing material 2, and the side faces of the sealing material 2 can receive more light irradiation, such that the side faces of the sealing material 2 are sintered, which can thus mitigate or avoid the phenomenon of an invalid package area, thereby achieving a better packaging between the display substrate and another substrate (for example, a cover plate).

According to some embodiments of the present disclosure, as shown in FIG. 1, after the sealing material 2 is arranged, a gap exists between the sealing material 2 and the side wall of the groove 11, such that more light can be reflected to the sealing material 2 via the side walls of the groove during the process of packaging the display substrate, which further facilitates sufficient sintering of the side faces of the sealing material 2. Further, as shown in FIG. 1, it is possible to form the groove such that the angle between the side wall of the groove and the bottom surface thereof is an obtuse angle, which would allow more of the light irradiated onto the side walls to be reflected to the sealing material 2.

The display substrate in the embodiment may be an OLED substrate or an array substrate used of a liquid crystal panel. The method for manufacturing a display substrate will be specifically described below in conjunction with the above two types of display substrates.

Figure 4:
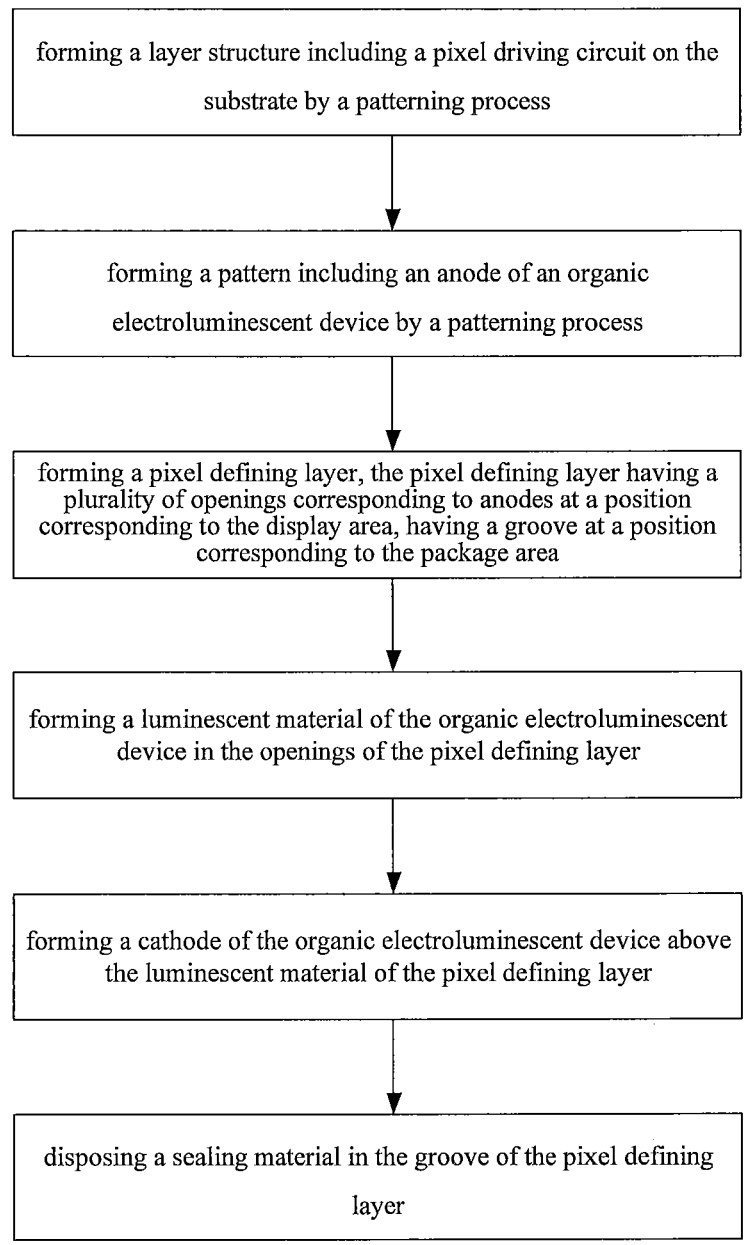
FIG. 4 is a flow chart of a method for manufacturing a display substrate provided by an embodiment of the present disclosure.

For an embodiment in which the display substrate is an OLED substrate, the interlayer insulating layer 1 comprises a pixel defining layer. As shown in FIG. 3 and FIG. 4, the manufacturing method specifically comprises the following steps:

Step 1: forming a layer structure 3 including a pixel driving circuit on the base substrate 10 by a patterning process. For example, a single driving unit of the pixel driving circuit may be 2T1C, that is, each pixel driving unit comprises a switching transistor, a driving transistor, and a storage capacitor.

Step 2: forming a pattern including an anode 12 of an organic electroluminescent device above the pixel driving circuit by a patterning process. The anode 12 of the organic electroluminescent device is connected to a drain of a driving transistor in the pixel driving circuit.

Step 3: forming a pixel defining layer by a patterning process, forming a plurality of openings in a region of the pixel defining layer corresponding to the display area Q1, each of the openings corresponding to an anode 12 of each organic electroluminescent device, that is, the anode 12 is located within each opening. Meanwhile, a pattern of the groove 11 is formed in the pixel defining layer at a position corresponding to the package area Q2.

In this embodiment, the pixel defining layer is the interlayer insulating layer described above. Forming the interlayer insulating layer may comprise: forming an insulating material layer above the base substrate 10, and patterning the insulating material layer to form a plurality of openings in the insulating material layer to thereby obtain a pixel defining layer, an orthographic projection of each opening on the base substrate being located within the display area; then providing an electroluminescent material in each opening.

In some embodiments, the plurality of openings and the groove are formed during the same patterning process, thereby simplifying the process steps and reducing the production cost.

Step 4: forming a luminescent material of the organic electroluminescent device in each opening of the pixel defining layer.

Step 5: forming a cathode of the organic electroluminescent device on the luminescent material.

Step 6: disposing a sealing material 2 in the groove 11 of the pixel defining layer on the base substrate 10 that has experienced the above steps, the sealing material 2 may comprise a frit. Thereafter, the display substrate may be packaged with another substrate (for example, a cover plate), for example, the frit may be irradiated with a light source such as laser light. At that time, the side walls of the groove 11 can reflect a part of the light to the sealing material 2, and the side faces of the sealing material 2 can receive more light irradiation, so that the side faces of the sealing material 2 are sintered, which can thus mitigate or avoid the phenomenon of an invalid package area, thereby achieving a better packaging effect between the display substrate and the cover plate.

Figure 5:
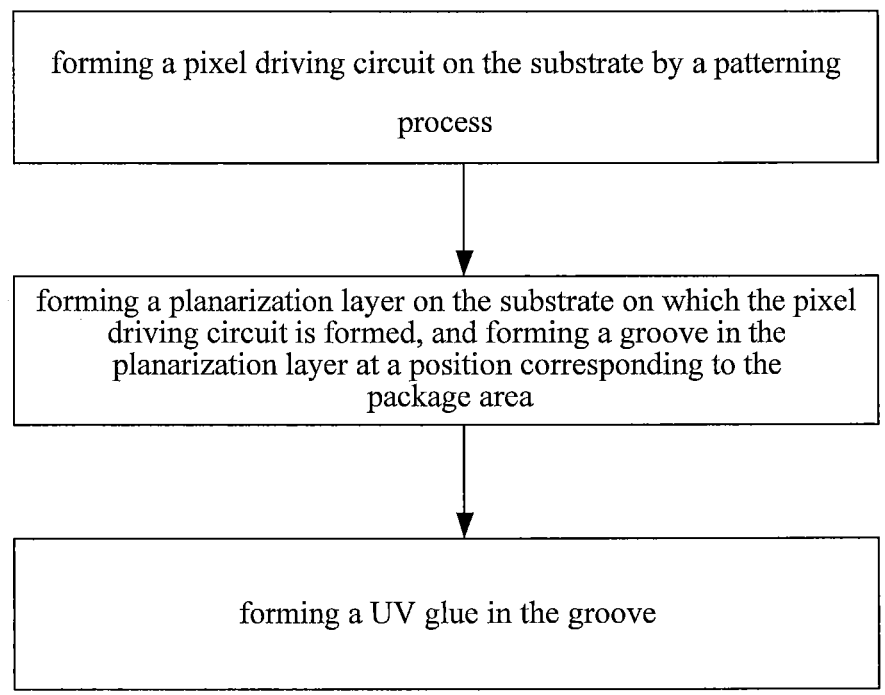
FIG. 5 is a flow chart of a method for manufacturing a display substrate provided by another embodiment of the present disclosure.

In another embodiment, the display substrate is an array substrate used in a liquid crystal panel, the sealing material 2 for the array substrate may be a UV glue, and the interlayer insulating layer 1 comprises a planarization layer in the array substrate. As shown in FIG. 5, the manufacturing method specifically comprises the following steps:

Step 1: forming a pixel driving circuit 3 (including a thin film transistor) on the base substrate 10 by a patterning process.

Step 2: forming a planarization layer on the base substrate 10 on which the pixel driving circuit has been formed, and forming a groove 11 in the planarization layer at a position corresponding to the package area Q2.

Step 3: forming a UV glue in the groove 11. During the process of performing a packaging process on the display substrate, the side walls of the groove 11 enable light irradiated thereon to be reflected to the UV glue, so that the UV glue can be cured by receiving light in different directions when it is subjected to light irradiation.

A further embodiment of the present disclosure provides a display device comprising the display substrate described in the foregoing embodiments. Since the interlayer insulating layer in the display substrate comprises the groove as described above and the sealing material disposed therein, a better sealing effect can be achieved to the display device of the embodiment.

The display device may be a liquid crystal display device or an electroluminescent display device, for example, any product or component having a display function such as a liquid crystal panel, an electronic paper, an OLED panel, a mobile phone, a tablet computer, a television, a display, a notebook computer, a digital photo frame, a navigator, and the like.

It is to be understood that the above embodiments are merely exemplary embodiments for explaining the principles of the present disclosure, but the protection scope of the present application is not limited thereto. Various modifications and improvements may be made by those ordinarily skilled in the art without departing from the spirit and essence of the disclosure, and such modifications and improvements are also regarded as falling within the scope of the present application.

The invention claimed is:

1. A display substrate comprising:
    a display area; and
    a package area surrounding the display area,
    wherein the display substrate comprises a base substrate and an interlayer insulating layer on the base substrate, wherein the interlayer insulating layer comprises a groove comprising a bottom surface and a side wall surrounding the bottom surface, wherein an orthographic projection of the groove on the base substrate is within an orthographic projection of the package area on the base substrate, and wherein the display substrate further comprises a sealing member made of sealing material within the groove, wherein the sealing member comprises a lower surface and an upper surface opposite to the lower surface, the lower surface directly contacts the bottom surface of the groove, and an area of the lower surface is less than an area of the bottom surface of the groove, and wherein the side wall surrounds the sealing member, and a gap exists between any position on the side wall and the sealing member.

2. The display substrate according to claim 1, wherein an angle between the side wall of the groove and the bottom surface of the groove is an obtuse angle.

3. The display substrate according to claim 1, wherein the interlayer insulating layer comprises a pixel defining layer, wherein the pixel defining layer comprises a plurality of openings to define a plurality of pixels in the display area, and wherein the display substrate further comprises an electroluminescent material in each of the plurality of openings.

4. The display substrate according to claim 3, wherein the sealing material comprises a frit.

5. The display substrate according to claim 1, wherein the display substrate further comprises a pixel driving circuit on the base substrate, and wherein the interlayer insulating layer comprises a planarization layer over the pixel driving circuit.

6. The display substrate according to claim 5, wherein the sealing material comprises a UV glue.

7. A method for manufacturing the display substrate according to claim 1, comprising:

providing the base substrate comprising the display area and the package area surrounding the display area;

forming the interlayer insulating layer on the base substrate, wherein the interlayer insulating layer comprises the groove; and providing the sealing material in the groove.

8. The method according to claim 7, wherein an angle between the side wall of the groove and the bottom surface of the groove is an obtuse angle.

9. The method according to claim 7, wherein forming the interlayer insulating layer comprises:

forming an insulating material layer over the base substrate;

patterning the insulating material layer to form a plurality of openings in the insulating material layer to thereby obtain a pixel defining layer, wherein an orthographic projection of each of the plurality of openings on the base substrate is within the display area; and providing an electroluminescent material in each of the plurality of openings.

10. The method according to claim 9, wherein the plurality of openings and the groove are formed during a same patterning process.

11. The method according to claim 9, wherein the sealing material comprises a frit.

12. The method according to claim 7, further comprising:

fabricating a pixel driving circuit on the base substrate, wherein forming the interlayer insulating layer comprises:

forming a planarization layer on the pixel driving circuit; and forming the groove in the planarization layer.

13. The method according to claim 12, wherein the sealing material comprises a UV glue.

14. A display device comprising the display substrate according to claim 1.

15. The display device according to claim 14, wherein an angle between the side wall of the groove and the bottom surface of the groove is an obtuse angle.

16. The display device according to claim 14, wherein the interlayer insulating layer comprises a pixel defining layer, wherein the pixel defining layer comprises a plurality of openings to define a plurality of pixels in the display area, and wherein the display substrate further comprises an electroluminescent material in each of the plurality of openings.

17. The display device according to claim 16, wherein the sealing material comprises a frit.

18. The display device according to claim 14, wherein the display substrate further comprises a pixel driving circuit on the base substrate, and wherein the interlayer insulating layer comprises a planarization layer over the pixel driving circuit.

19. The display substrate according to claim 1, wherein the groove is on a side of the interlayer insulating layer facing away from the base substrate.

* * * * *